(12) United States Patent
Strangman et al.

(10) Patent No.: US 7,556,695 B2
(45) Date of Patent: Jul. 7, 2009

(54) APPARATUS TO MAKE NANOLAMINATE THERMAL BARRIER COATINGS

(75) Inventors: Thomas E. Strangman, Prescott, AZ (US); Derek Raybould, Denville, NJ (US)

(73) Assignee: Honeywell International, Inc., Morristown, NJ (US)

( * ) Notice: Subject to any disclaimer, the term of this patent is extended or adjusted under 35 U.S.C. 154(b) by 487 days.

(21) Appl. No.: 10/140,343

(22) Filed: May 6, 2002

(65) Prior Publication Data

US 2003/0207031 A1 Nov. 6, 2003

(51) Int. Cl.
*C23C 16/00* (2006.01)
(52) U.S. Cl. .............. 118/726; 118/723 E; 118/723 EB; 118/725; 118/730
(58) Field of Classification Search .......... 118/723 EB, 118/723 E, 725, 726, 729, 730
See application file for complete search history.

(56) References Cited

U.S. PATENT DOCUMENTS

| | | | |
|---|---|---|---|
| 3,205,087 A | 9/1965 | Allen | |
| 3,655,430 A | 4/1972 | Greaves | |
| 3,840,986 A * | 10/1974 | Schmidtke et al. ............ | 29/852 |
| 4,109,061 A | 8/1978 | Beale | |
| 4,153,005 A | 5/1979 | Norton et al. | |
| 4,380,212 A * | 4/1983 | Kraus ......................... | 118/720 |
| 4,632,059 A | 12/1986 | Flatscher et al. | |
| 4,676,994 A | 6/1987 | Demaray | |
| 4,868,003 A * | 9/1989 | Temple et al. ................ | 118/719 |
| 4,916,022 A | 4/1990 | Solfest et al. | |
| 5,087,477 A | 2/1992 | Giggins, Jr. et al. | |
| 5,262,245 A * | 11/1993 | Ulion et al. .................. | 428/469 |
| 5,407,705 A | 4/1995 | Vakil | |
| 5,418,003 A | 5/1995 | Bruce et al. | |
| 5,534,314 A | 7/1996 | Wadley et al. | |
| 5,652,044 A | 7/1997 | Rickerby | |

(Continued)

FOREIGN PATENT DOCUMENTS

EP 0 705 912 A2 4/1996

(Continued)

OTHER PUBLICATIONS

International Search Report PCT/US03/14138, Aug. 28, 2003.

(Continued)

*Primary Examiner*—Parviz Hassanzadeh
*Assistant Examiner*—Rakesh K Dhingra
(74) *Attorney, Agent, or Firm*—Ingrassia Fisher & Lorenz, P.C.

(57) ABSTRACT

Methods and apparatus to make multilayer thermal barrier coatings for superalloy substrates such as turbine blades or vanes are disclosed. The methods produce non-homogeneous, nanometer-size, successive layers and a non-homogeneous interfacial layer without the use of baffles. Methods are also disclosed to use a lower cost metallic source and an oxygen bleed to create alumina or tantalum oxide vapor, to use a tantalum oxide or an alumina ingot and a low pressure inert gas feed to direct the vapor clouds, to use pulsed evaporation from a secondary vapor source to create non-homogeneous multilayer coating on non-rotated substrates, to use an electric bias to direct the vapor clouds, and to use a mechanical system to direct the vapor clouds or move and position the article to be coated in the clouds.

25 Claims, 5 Drawing Sheets

U.S. PATENT DOCUMENTS

| | | | |
|---|---|---|---|
| 5,674,813 | A | 10/1997 | Nakamura et al. |
| 5,773,078 | A | 6/1998 | Skelly |
| 5,834,070 | A | 11/1998 | Movchan et al. |
| 5,846,605 | A | 12/1998 | Rickerby et al. |
| 5,998,003 | A | 12/1999 | Courtright et al. |
| 6,054,184 | A | 4/2000 | Bruce |
| 6,110,604 | A | 8/2000 | Rickerby |
| 6,127,006 | A | 10/2000 | Schulz et al. |
| 6,143,141 | A | 11/2000 | Leverant et al. |
| 6,210,744 | B1 | 4/2001 | Hayess et al. |
| 6,251,504 | B1 * | 6/2001 | Jaslier et al. ............... 428/210 |
| 6,455,173 | B1 * | 9/2002 | Marijnissen et al. ........ 428/623 |
| 6,620,465 | B2 * | 9/2003 | Rigney et al. ............... 427/567 |
| 6,620,525 | B1 * | 9/2003 | Rigney et al. ............... 428/633 |
| 2004/0118347 | A1 * | 6/2004 | Groves et al. ......... 118/723 EB |
| 2004/0134430 | A1 * | 7/2004 | Hass et al. ............ 118/723 EB |
| 2005/0000444 | A1 * | 1/2005 | Hass et al. ............ 118/723 EB |

FOREIGN PATENT DOCUMENTS

| | | | |
|---|---|---|---|
| EP | 1 074 638 | A1 | 2/2001 |
| WO | WO 01/10795 | * | 2/2001 |
| WO | WO 01/11107 | A1 | 2/2001 |

OTHER PUBLICATIONS

Schienle, J., *Tailoring Zirconia Coatings for Performance in Marine Gas Turbine Environment*, Paper No. 89-GT-269 presented at ASME 34$^{th}$ International Gas Turbine and Aeroengine Congress and Exposition, Toronto, Canada, Jun. 1989. (Also published in Trans. ASME: Journal of Engineering for Gas Turbine and Power, 112 (1990) 531-535.

* cited by examiner

APPARATUS TO MAKE NANOLAMINATE THERMAL BARRIER COATINGS

GOVERNMENT RIGHTS

This invention was made with Government support under Contract No. N00421-01-0019 awarded by the United States Navy. The Government has certain rights in this invention.

BACKGROUND OF THE INVENTION

The present invention generally relates to apparatus and methods for forming nanolaminate thermal barrier coatings for turbine engine blades and vanes and more specifically to apparatus and methods for forming thermal barrier coatings composed of a series of non-homogeneous nanometer—to micron-sized layers for turbine blades or vanes.

Increased gas turbine engine operating temperatures often result from efforts to improve on overall engine efficiency as well as to reduce emission of contaminants released to atmosphere. Increased operating temperatures, however, result in concerns over the ability of various engine components, such as turbine blades and vanes, to remain durable and maintain their mechanical strength. These concerns have been addressed in the following two principal ways: first, the formulation of superalloys, such as nickel and cobalt based, having high temperature capabilities; and, second, the application of protective thermal barrier coatings (TBC's) which insulate the components thus minimizing their service temperatures.

Referring to the application of protective coatings, it is known that the characteristics of TBC's must include the capability to strongly adhere and remain adhered to the component to which it is applied, and low thermal conductivity. Typically, TBC's applied to superalloy substrates have included a bond coat and a ceramic top layer, the latter being applied either by the process of plasma spraying or by the process of electron beam physical vapor deposition (EB-PVD). Use of the EB-PVD process results in the outer ceramic layer having a columnar grained microstructure. Gaps between the individual columns allow the columnar grains to expand and contract without developing stresses that could cause spalling. Prior art has disclosed thermal barrier coatings for superalloy substrates that contain a MCrAlY layer, an alumina layer, and an outer columnar grained ceramic layer. Also TBC's for superalloy substrates have included those that contain an aluminide layer, an alumina layer, and an outer columnar grained ceramic layer with the ceramic layer commonly being zirconia stabilized with yttria.

U.S. Pat. No. 4,676,994 to Demaray discloses that a layer of dense stabilized zirconia can be deposited onto the bond coating when the gas pressure within the chamber is less than 0.0001 torr. Subsequent injection of oxygen at a pressure of 0.0001 to 0.01 torr into a stabilized zirconia vapor cloud increases the oxygen content of the ceramic layer and initiates growth of substantially stoichiometric columnar ceramic grains with intercolumnar porosity for strain tolerance. Tubes and nozzles are used to direct the oxygen gas to impinge upon the substrate.

U.S. Pat. No. 5,534,314 to Wadley et al. discloses the use of a carrier gas to entrain the evaporant in the carrier gas stream and coating the part with the carrier gas stream containing the entrained evaporant. Depending upon the requirements of the coating, the carrier gas may be oxygen, nitrogen, helium or another inert gas such as, methane or acetylene. The carrier gas is used to increase the deposition rate onto the substrate and, because gas is used with associated pressure (0.001 torr to 1 atmosphere), the coating is more uniform on complex shaped parts and less line of sight limited. The process disclosed by Wadley does not deal with nanolaminates.

U.S. Pat. No. 6,054,184 to Bruce et al. discloses a method and apparatus for forming a multilayer thermal barrier coating such that the coating is composed of substantially homogeneous layers of different materials. The process requires two ceramic vapor sources separated by a baffle to make multi-layer TBC's composed of homogeneous successive layers of stabilized zirconia+alumina. The use of a baffle significantly reduces the efficiency of deposition, as much of the vapor cloud is wastefully deposited on the baffle.

U.S. patent application Ser. No. 09/535,394, filed Mar. 24, 2000, which Applicant hereby incorporates herein by reference, filed on behalf of the assignor herein, discloses a thermal barrier coating which includes a columnar grained ceramic layer applied to an aluminide or MCrAlY bond coat by EB-PVD. The ceramic layer is comprised of a plurality of layers of zirconia stabilized with 20 percent yttria and the interfaces between the layers are decorated with particles selected from a group consisting of $Ta_2O_5$ and alumina. A baffle is not required but is optional in the disclosed process which is aimed at producing a lower conductivity thermal barrier coating.

Although prior art has resulted in various improved methods and apparatus for thermal barrier coatings, none results in columnar grained thermal barrier coatings composed of a multitude of non-homogeneous, nanometer—to micron size, successive layers separated by non-homogeneous interfaces stabilized by nanometer-sized second phase particles.

As can be seen, there is a need for an improved apparatus and method for forming non-homogeneous nanometer—to micron-sized multi-layer thermal barrier coatings for superalloy substrates such as turbine blades or vanes.

SUMMARY OF THE INVENTION

In one aspect of the present invention, a thermal barrier coating deposition apparatus is disclosed. It comprises: a vacuum chamber; a primary crucible and an offset secondary crucible placed within the vacuum chamber; a ceramic material within the primary crucible; a metallic or ceramic material placed within the secondary crucible; two electron beam guns within the vacuum chamber each producing electron beams aimed, one toward the ceramic material within the primary crucible and another toward the metallic or ceramic material within the secondary crucible; articles on a rotary holder placed internally within the vacuum chamber; the rotary holder being positioned within the chamber such that the angle formed by the article holder's rotation axis and the center of the evaporation surface of the materials within the primary and secondary crucibles is 20 degrees or greater; oxygen bleed supply tubes protruding into the vacuum chamber aimed in the direction of the vapor cloud and the articles; whereby upon actuation of the electron beam guns and release of the oxygen gas, ceramic and/or oxidized metallic vapor clouds together with rotation of the articles within the vapor clouds coats the articles with a multilayer thermal barrier coating composed of an alternating sequence of non-homogeneous, nanometer—to micron thickness layers of ceramic material which have dispersed molecules of the oxidized secondary material, with a multiphase interfacial layer containing primary and secondary oxides separating each. The primary layer thickness and interface layer composition are established by controlling the electron beam power applied to the evaporation sources and the rate of specimen rotation.

In another aspect of the present invention, there is disclosed an apparatus comprising: a vacuum chamber; a primary crucible containing ceramic materials and a secondary crucible containing metallic or ceramic materials; a plurality of electron beam guns emitting electron beams aimed at the material within the crucibles; articles to be thermal barrier coated placed on a holder internally within the vacuum chamber; a plurality of tubes protruding into the vacuum chamber supplying oxygen gas to the articles; whereby upon actuation of the electron beam guns and release of the oxygen gas, ceramic and oxidized metallic vapor clouds are produced from the crucibles coating the articles with a multilayer thermal barrier coating composed of an alternating sequence of non-homogeneous nanometer—to micron-thickness layers of the primary ceramic material which have dispersed molecules of the oxidized secondary material, with a multiphase interfacial layer, consisting of finely dispersed particles of oxidized secondary material and the primary ceramic material separating each.

In yet another aspect of the present invention, a method of depositing a thermal barrier coating on articles is disclosed. The method comprises the steps of: positioning one or more articles, such as turbine blades or vanes, within the mixing zone of a primary ceramic vapor cloud and a secondary metallic vapor cloud; simultaneously heating and melting a portion of each of the ceramic and metallic materials to produce vapor clouds; adding oxygen to convert metallic vapor to an oxide vapor; apportioning power from an electron beam to the ceramic and metallic sources; rotating the articles within the combined vapor clouds such that the mixed vapors may deposit a multilayer thermal barrier coating; controlling the rates of coating deposition such that the multilayer zone within the thermal barrier coating has a minimum of one interfacial layer per micron of coating thickness.

In yet one final aspect of the present invention, a method of thermal barrier coating is disclosed, said method comprising the steps of: positioning one or more articles within the mixing zone of the primary ceramic vapor cloud and the secondary ceramic or oxidized metallic vapor cloud; simultaneously heating and melting a portion of each of said ceramic and metallic materials to produce vapor clouds and adding oxygen gas; apportioning power from electron beams such that the majority of the deposited vapor is derived from the primary ceramic source; pulsing power to enable deposition of a multilayer thermal barrier coating and a multiphase interfacial layer separating each of the primary material layers.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The present invention generally provides methods to make multiple layer thermal barrier coatings for superalloy substrates such as turbine blades or vanes, without use of a baffle. The process results in a thermal barrier coating composed of non-homogeneous nanometer—to micron-size layers separated by a non-homogeneous interfacial layer composed of secondary and primary ceramic oxides.

Methods are also disclosed to use a lower-cost metallic source and an oxygen bleed to create alumina or tantalum oxide vapor, to use a tantalum oxide or an alumina ingot and a low pressure oxygen or inert gas bleed to direct the ceramic or oxidized metallic vapor cloud produced by the secondary evaporation source, to use pulsed evaporation from a secondary vapor source to create non-homogeneous multilayer coating on non-rotated substrates, to ionize the vapor and use an electric bias on the component to attract the vapor and produce dense layers within the coating, and to use a mechanical system to cyclically position the article to be coated in the primary and secondary vapor clouds. This is unlike prior art whereby two ceramic vapor sources separated by a baffle are needed to make multilayer thermal barrier coatings composed of homogeneous successive layers of stabilized zirconia+alumina.

Figure 1:
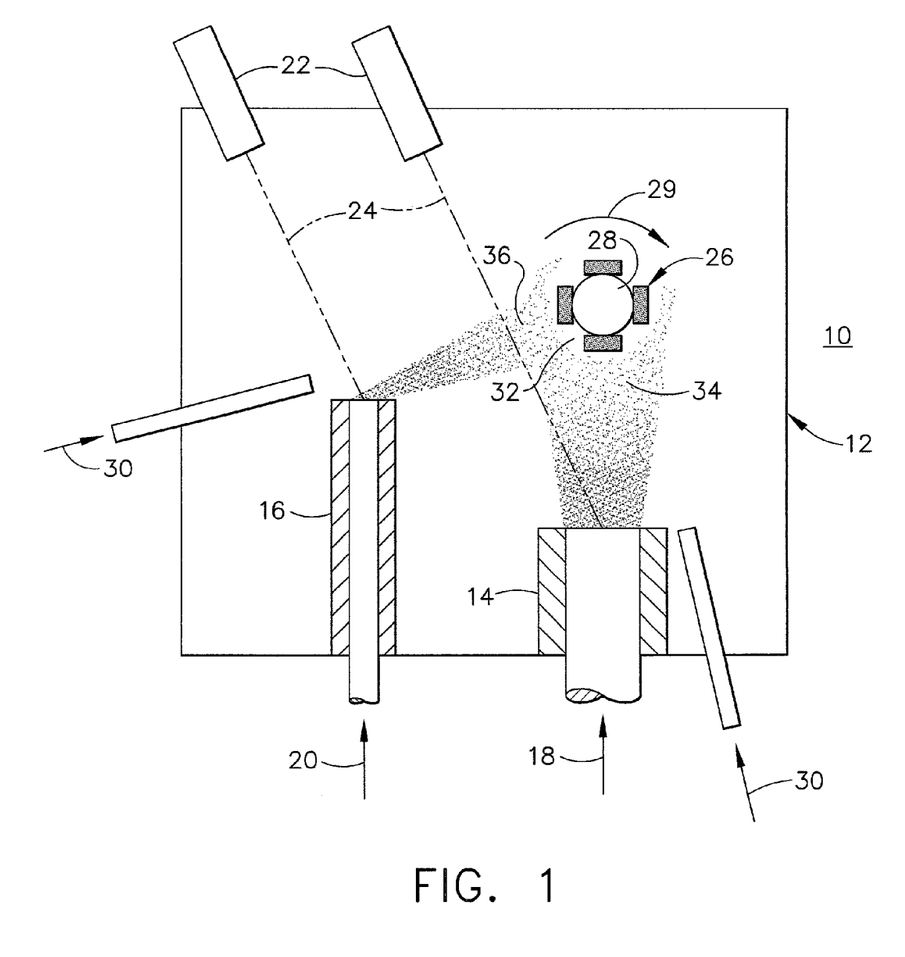
FIG. 1 is a schematic elevational view of a dual source electron beam physical vapor deposition process apparatus according to an embodiment of the present invention.

Referring to the accompanying drawings (in which like reference numerals indicate like parts throughout several views), and in particular to FIG. 1, there is shown a schematic elevational view of a dual source EB-PVD process apparatus 10 according to an embodiment of the present invention. The deposition process apparatus 10 may be comprised of a vacuum chamber 12 internal to which may be placed a primary crucible 14 and a secondary crucible 16. Primary crucible 14 includes a primary longitudinal centerline and may contain a ceramic material such as a stabilized zirconia ingot 18. The ceramic material includes an evaporation surface that defines a plane with which the primary longitudinal centerline intersects to form a first intersection point. The secondary crucible 16 includes a secondary longitudinal centerline and may contain a metallic or ceramic material, such as an $Al_2O_3$, Al, $Ta_2O_5$, or Ta ingot 20. The metallic or ceramic material includes an evaporation surface that defines a plane with which the secondary longitudinal centerline intersects to form a second intersection point. Protruding into the vacuum chamber 12 may be two electron beam guns 22 of a configuration well known in the art. Said electron beam guns may be arranged such that corresponding electron beams 24 are aimed, one to the evaporation surface of the coating material within said primary crucible 14, and the other to the evaporation surface of the coating material within the secondary crucible 16. Articles 26, such as turbine blades, vanes, or other similar components, may be placed on a rotary holder 28 which may rotate about an axis of rotation in a direction such as shown by arrow 29. The rotary holder 28 may be positioned within the vacuum chamber 12 such that an angle formed between two imaginary lines, one extending from a center of the evaporation surface of the material within the primary crucible 14 and one extending from a center of the evaporation surface of the material within the secondary crucible 16 to intersect at the article holder's rotation axis (a center of rotation 29), may be 20 degrees or greater. One or more oxygen bleed 30 supply tubes may be placed on the sides of vacuum chamber 12 such that a measured supply of oxygen may be aimed in the direction of articles 26. Upon actuation of the electron beam guns a ceramic vapor cloud 34 and an oxidized metallic or ceramic vapor cloud 36 may be produced.

The dual source EB-PVD process, using the apparatus depicted in FIG. 1, involves the following steps:

1. Positioning one or more articles 26 within the mixing zone 32 of the primary ceramic vapor cloud 34 and the secondary ceramic or oxidized metallic vapor cloud 36 produced by separate vapor sources. The primary source may be a ceramic material, such as a stabilized zirconia ingot 18, and the second source may be a ceramic or metallic material, such as an $Al_2O_3$, Al, $Ta_2O_5$, or Ta ingot 20.
2. Simultaneously heat, melt, and evaporate a portion of each of the ceramic and metallic materials to produce a primary ceramic vapor cloud 34 and a secondary ceramic or oxidized metallic vapor cloud 36 that coexist within vacuum chamber 12. Oxygen may be added to the chamber through oxygen bleed 30 supply tubes to convert metallic vapor to an oxide vapor and direct it toward the articles on the rotating holder 28. The pressure of the oxygen in the chamber may be in the range of 0.0001 to 0.01 torr during coating deposition.
3. Power from electron beam 24 may be apportioned to the primary and secondary sources; at least 85% of the vapor that deposits onto the article 26 will be derived from the primary ceramic source; at least 1% of the vapor that deposits onto the article 26 may be derived from the secondary metallic or ceramic source.
4. Rotate the article 26 within the combined vapor clouds 34 and 36 such that the mixed vapors may deposit a multilayer TBC composed of an alternating sequence of non-homogeneous layers; layers may be composed of the primary ceramic material which may have dispersed oxide molecules or particles of the second material; a interfacial layer composed of secondary and primary phase particles may separate each of the primary ceramic layers; interfacial layers may consist of a mixture of finely dispersed, nanometer—sized particles of the secondary ceramic or oxidized metallic material, the primary ceramic material, and nanometer-size porosity.
5. Controlling the rates of coating deposition and article 26 rotation rates such that the multilayer zone within the TBC may have a minimum of one interfacial layer per micron of coating thickness.
6. Thermal radiation from the evaporating ingot sources and electrical resistance heaters (not shown) may maintain article surfaces at temperatures within the 950° to 1150° C. range during coating deposition, with temperatures in the 1000° to 1100° C. range being preferred.

Figure 2:
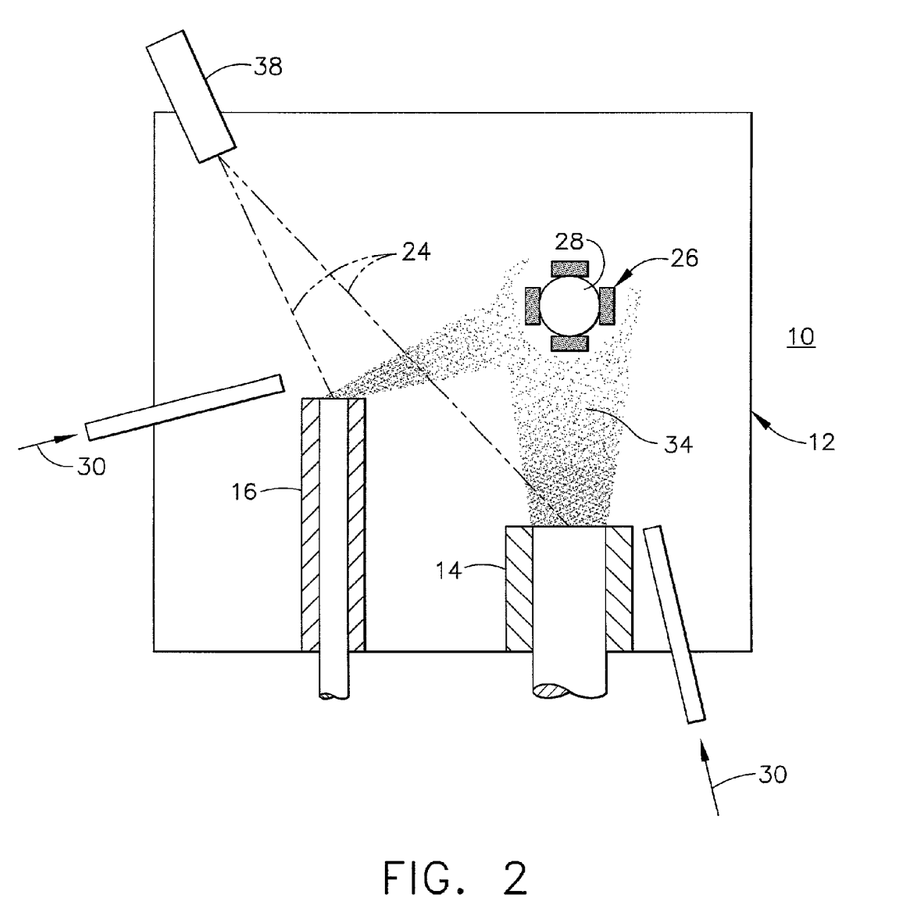
FIG. 2 is a schematic elevational view of a dual source, single electron beam physical vapor deposition process apparatus according to another embodiment of the present invention.

Referring now to FIG. 2, there is shown a schematic elevational view of a dual source, single-gun EB-PVD process apparatus according to another embodiment of the present invention. Said deposition process apparatus 10 is comprised of essentially the same elements as the apparatus depicted in FIG. 1, and includes a vacuum chamber 12, a primary crucible 14, a secondary crucible 16, correspondingly containing ceramic and metallic material, articles 26 positioned on a rotating holder 28, and oxygen bleed 30 supply tubes. However, the electron beams 24 may be provided by a single electron beam gun 38, from which power is apportioned between the two vapor sources. The electron beams 24 may jump rapidly between the ingot sources (up to several hundred times per second) to achieve continuous rates of evaporation during the multilayer TBC deposition process, which, in all other respects, is the same as described above for the apparatus of FIG. 1.

Other alternate embodiments, applicable to the EB-PVD process apparatus of FIGS. 1 and 2 may involve substituting the metallic, Al or Ta ingot 20, with an oxide ingot (e.g., alumina or tantalum oxide). Also a further variation may be the use of a low pressure inert gas, such as argon, to replace the oxygen being introduced through the oxygen bleed 30 supply tubes, and direct the vapor cloud from the Al or Ta ingot 20. Oxygen may still be bled into the system using other inlets or with the inert gas.

Figure 3:
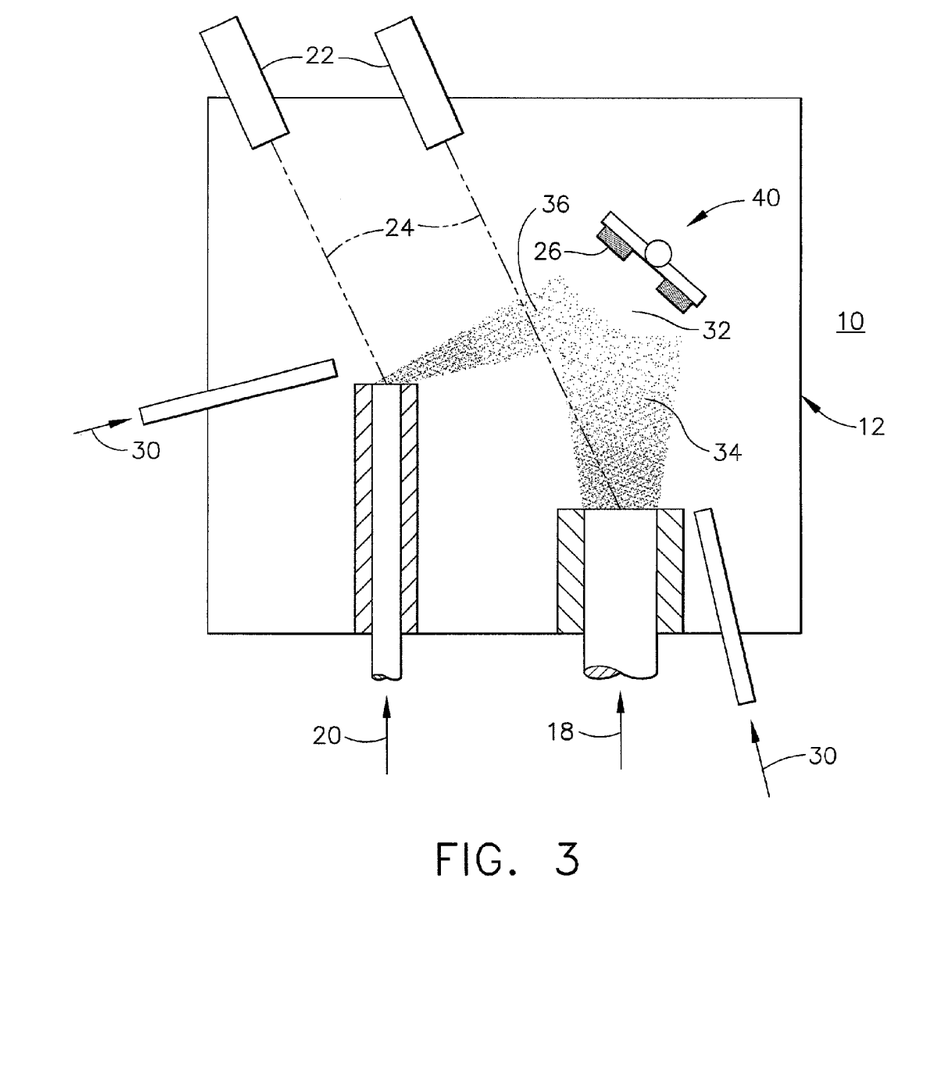
FIG. 3 is a schematic elevational view of a pulse source, dual electron beam physical vapor deposition process apparatus according to another embodiment of the present invention.

Referring now to FIG. 3 there is shown a schematic elevational view of a pulse source, dual electron beam gun EB-PVD process apparatus according to yet another embodiment of the present invention. The deposition process apparatus 10 may be comprised of a vacuum chamber 12 internal to which may be placed a primary crucible 14 and a secondary crucible 16. Primary crucible 14 may contain a ceramic material such as a stabilized zirconia ingot 18 whereas the secondary crucible 16 may contain a ceramic or metallic material, such as an $Al_2O_3$, Al, $Ta_2O_5$, or Ta ingot 20. Protruding into to the vacuum chamber 12 may be two electron beam guns 22 of a configuration well known in the art. Said electron beam guns may be arranged such that corresponding electron beams 24 are aimed, one to the upper surface of the ceramic material within said primary crucible 14, and the other to the upper surface of the ceramic or metallic material within the secondary crucible 16. Articles 26, such as turbine shrouds (blade outer air seals) or combustion components, may be placed on a non-rotating holder 40. Oscillation of the holder about its axis is permitted but not required. Two oxygen bleed 30 supply tubes may be placed on the sides of vacuum chamber 12 such that a measured supply of oxygen may be aimed in the direction of articles 26. Upon actuation of the electron beam guns a ceramic vapor cloud 34 and a ceramic or oxidized metallic vapor cloud 36 may be produced. Power to the electron beam gun 22 directed at the material within the secondary crucible 16 may be periodically pulsed to change the evaporation rate so that the deposition rate of material from the secondary ingot increases from less than 1% to a maximum of 50% of the rate of deposition of the material evaporated from the primary ceramic stabilized zirconia ingot.

The pulsed source EB-PVD process using the apparatus depicted in FIG. 3, involves the following steps:

1. Positioning one or more articles 26 within the mixing zone 32 of the primary ceramic vapor cloud 34 and the secondary ceramic or oxidized metallic vapor cloud 36 produced by separate evaporation sources. The primary source may be a ceramic material, such as a stabilized zirconia ingot 18, and the second source may be a ceramic or metallic material, such as $Al_2O_3$, Al, $Ta_2O_5$ or Ta ingot 20.
2. Simultaneously heat and melt a portion of each of the primary ceramic and secondary ceramic or metallic materials to produce a ceramic vapor cloud 34 and a ceramic or metallic vapor cloud 36 that coexist within the vacuum chamber 12. Oxygen gas may be added to the chamber through oxygen bleed 30 supply tubes to convert metallic vapor to an oxide vapor and direct it toward the articles 26 on the non-rotating holder 40.
3. Power from electron beams 24 may be apportioned between the primary and secondary sources; at least 85% of the vapor that deposits onto the article will be derived from the primary ceramic source; at least 1% of the vapor that deposits onto the article may be derived from the secondary metallic source;

4. Power to the secondary ceramic or metallic source may be pulsed to enable deposition of a multilayer TBC composed of an alternating sequence of non-homogeneous layers; layers are composed of the primary ceramic material which may have dispersed oxide particles (molecules) of the second material; a multiphase interfacial layer separates each of the primary material layers; interfacial layers consist of a mixture of finely dispersed, nanometer—sized particles of the secondary ceramic or oxidized metallic material, the primary ceramic material, and nanometer-size porosity.

5. Controlling the rates of pulsed deposition from the secondary such that the multilayer zone within the TBC may have a minimum of one interfacial layer per micron of coating thickness.

6. In addition to periodically increasing and decreasing the power to the electron beams 24, pulsed evaporation from the secondary evaporation source may also be achieved by changing the raster pattern of a focused electron beam 24 from a large area to a small area or changing the power density of the electron beam 24 from a large beam (low power density) to a focused beam (high power density).

An alternate embodiment of the apparatus and described in FIG. 3 may entail substituting the metallic, Al or Ta ingot 20, with an oxide ingot (e.g., alumina or tantalum oxide).

Figure 4:
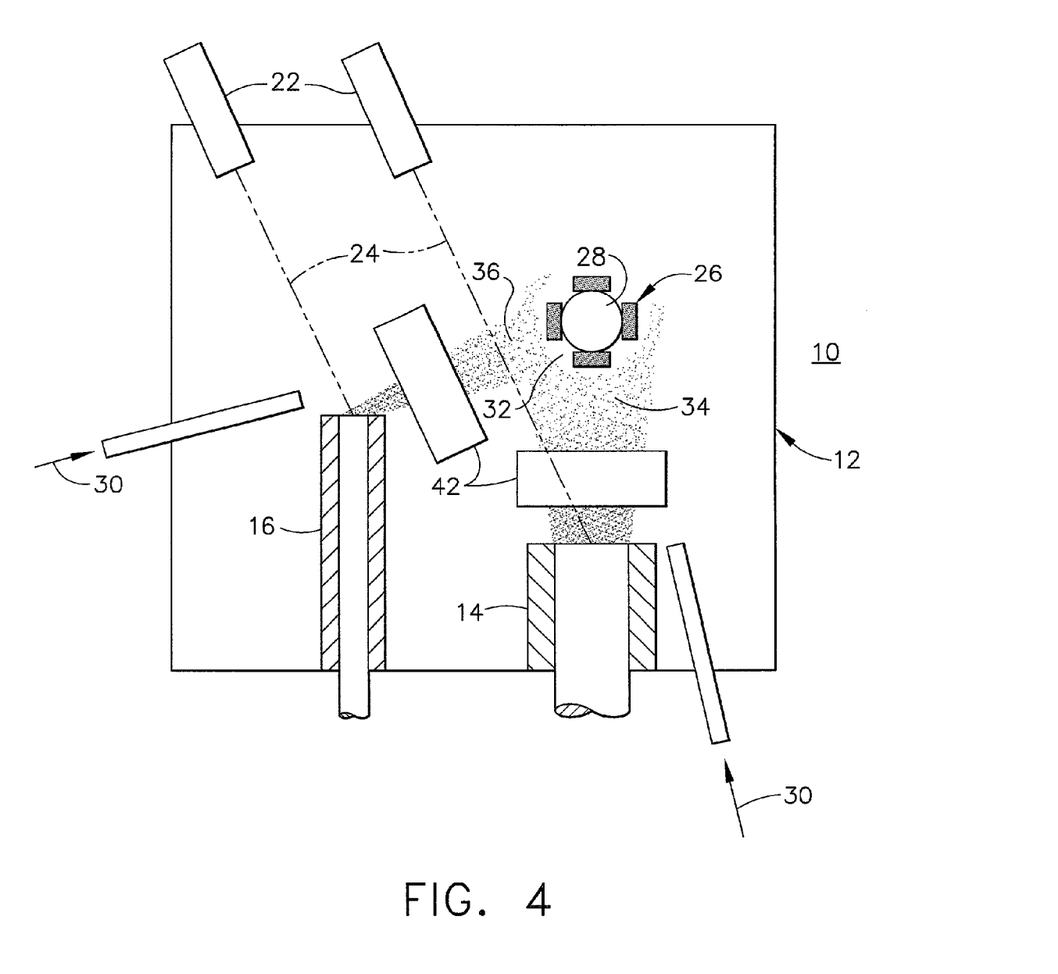
FIG. 4 is a schematic elevational view of a dual source electron beam physical vapor deposition process apparatus involving ionization of the evaporated vapor according to another embodiment of the present invention.

FIG. 4 is a schematic elevational view of a dual source EB-PVD process apparatus involving ionization of the evaporated vapor according to yet another embodiment of the present invention. Said deposition process apparatus 10 is comprised of essentially the same elements as the apparatus depicted in FIG. 1, and includes a vacuum chamber 12, a primary crucible 14, a secondary crucible 16, correspondingly containing ceramic and metallic material, articles 26 positioned on a rotating holder 28, and oxygen bleed 30 supply tubes. Electron beams 24 may be provided by dual electron beam guns 22. Radio Frequency (RF) ion generators, of a configuration well known in the art, may be utilized to generate RF electrical fields 42 used to ionize the ceramic and metallic vapor clouds 34 and 36, which may then be electrically attracted to articles 26. This process may be used to alter the coating's ceramic microstructure or improve deposition efficiency. Since ionized molecules are more energetic, ionized vapor fluxes may also be used to densify (e.g., eliminate intercolumnar gaps) at the surface and/or zones within the coating. Deposited coating microstructure may be controlled by adjusting the ionization power and the electrical bias voltage applied to the articles being coated.

Figure 5:
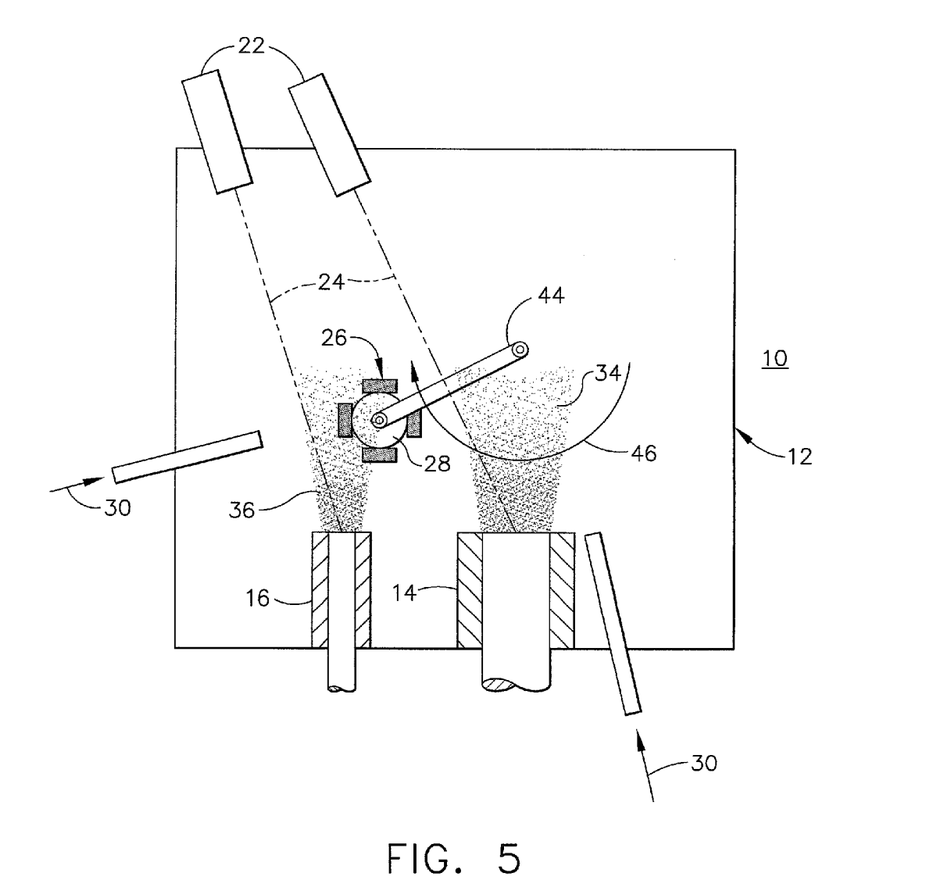
FIG. 5 is a schematic elevational view of a dual source electron beam physical vapor deposition process apparatus according to yet another embodiment of the present invention.

Yet another embodiment, shown in FIG. 5, is of a dual source EB-PVD apparatus in which a mechanical device moves articles 26 through the vapor clouds. Said deposition process apparatus 10 is comprised of essentially the same elements as the apparatus depicted in FIG. 1, and includes a vacuum chamber 12, a primary crucible 14, a secondary crucible 16, correspondingly containing ceramic and metallic material, and oxygen bleed 30 supply tubes. Electron beams 24 may be provided by dual electron beam guns 22. Articles 26 may be positioned on rotating holder 28, which may swing, by means of swing arm 44, in the direction of swing arc 46 between ceramic vapor cloud 34 and metallic vapor cloud 36. Electron beam power may be apportioned to the primary and secondary evaporation sources in such a manner that the composition of the multilayered ceramic coating contains at least 85% yttria stabilized zirconia and the amount of the secondary ceramic constituent (alumina or tantalum oxide) may be between 1 and 15%. Swing arm 44 may enter vacuum chamber 12 from the side or from the top (roof). FIG. 5 depicts one method that may be used to mechanically move the specimens in to and out of the primary and secondary vapor clouds. It will be understood that other methods are possible. For example instead of a "swinging" arm 44 as shown in FIG. 5, the arm 44 may rotate through 360°.

It should be understood, of course, that the foregoing relates to preferred embodiments of the invention and that modifications may be made without departing from the spirit and scope of the invention as set forth in the following claims.

We claim:

1. A thermal barrier coating deposition apparatus for coating an article, the apparatus comprising:

a vacuum chamber;

at least one electron beam gun disposed at least partially within said vacuum chamber and configured to emit at least one electron beam;

a primary crucible configured to contain a primary ceramic material and positioned within said vacuum chamber to produce a first vapor cloud of the primary ceramic material when impacted by said at least one electron beam;

a secondary crucible configured to contain a secondary ceramic or metallic material and positioned within said vacuum chamber to produce a second vapor cloud of the secondary ceramic or metallic material when impacted by said at least one electron beam, said second vapor cloud entering into a mixing zone of said first vapor cloud and said second vapor cloud;

a rotary holder rotationally mounted within said vacuum chamber and adapted to hold and rotate the article and positioned relative to said primary crucible and said secondary crucible such that the article is rotated within said first vapor cloud and said mixing zone of the first vapor cloud and the second vapor cloud so that only two non-homogeneous alternating layers are deposited on the article, a first of said only two non-homogeneous alternating layers comprising said primary ceramic material and a second of said only two non-homogeneous alternating layers comprising an interfacial layer of said primary ceramic material and said secondary ceramic or metallic material the first and second vapor clouds coexisting within the vacuum chamber while the article is rotated on the rotary holder; and one or more oxygen bleed supply tubes protruding into said vacuum chamber, said oxygen bleed supply tubes aimed in the direction of the rotary holder.

2. The thermal barrier coating deposition apparatus of claim 1, wherein said secondary ceramic or metallic material is a tantalum oxide ingot or an alumina ingot.

3. The thermal barrier coating deposition apparatus of claim 1, wherein the article to be coated is a turbine blade, vane, shroud segment, or combustor component, and said rotary holder rotates said article within said vacuum chamber.

4. The thermal barrier coating deposition apparatus of claim 1, wherein said at least one electron beam gun is configured such that power from said at least one electron beam is apportioned to said primary and secondary crucibles such that at least 85% of a vapor that deposits onto the article to be coated will be derived from said primary ceramic material and at least 1% of said vapor that deposits onto the article to be coated will be derived from said secondary ceramic or metallic material within said secondary crucible.

5. The thermal barrier coating deposition apparatus of claim 4, wherein said at least one electron beam gun is configured such that power from said at least one electron beam gun directed at said secondary ceramic or metallic material within said secondary crucible is periodically pulsed to change a deposition rate of said secondary ceramic or metallic material from less than 1% to about 1-50% of a rate of deposition of said primary ceramic material, and to enable deposition of a multilayer thermal barrier coating composed of a sequence of non-homogeneous layers.

6. The thermal barrier coating deposition apparatus of claim 5, wherein said at least one electron beam gun is configured such that pulsed evaporation from said secondary crucible is achieved by changing a raster pattern of said at least one electron beam from a large area to a small area.

7. The thermal barrier coating deposition apparatus of claim 5, wherein said at least one electron beam gun is configured such that pulsed evaporation from said secondary crucible is achieved by changing a power density of said at least one electron beam from a large beam to a focused beam.

8. The thermal barrier coating deposition apparatus of claim 1, wherein said at least one electron beam gun is configured such that rates of coating deposition and a rate of article rotation are controlled such that a multilayer zone within a thermal barrier coating formed on the article may have a minimum of one said interfacial layer per micron of coating thickness, and each said interfacial layer consists of a mixture of finely dispersed particles of the secondary ceramic or metallic material and the primary ceramic material.

9. The thermal barrier coating deposition apparatus of claim 1, wherein said at least one electron beam gun protrudes into said vacuum chamber, and said at least one electron beam gun is configured such that said at least one electron beam emitted from said at least one electron beam gun jumps rapidly between said primary ceramic material and said secondary ceramic or metallic material within said primary and secondary crucible to achieve continuous rates of evaporation of said primary ceramic material and said secondary ceramic or metallic material during a multilayer thermal barrier coating deposition process.

10. The thermal barrier coating deposition apparatus of claim 1, further comprising a gas source coupled to supply an inert gas and oxygen gas through said one or more oxygen bleed supply tubes aimed in the direction of an article.

11. The thermal barrier coating deposition apparatus of claim 1, wherein the rotary holder is configured so that the article to be coated is rotatably mounted on the rotary holder.

12. The thermal barrier coating deposition apparatus of claim 1, further comprising at least one radio frequency (RF) generator for ionizing said first vapor cloud and/or said second vapor cloud.

13. The thermal barrier coating deposition apparatus of claim 12, further comprising a power source for applying an electrical bias voltage to the article to be coated and to thereby attract and increase a deposition energy of the ionized first and/or second vapor clouds.

14. The thermal barrier coating deposition apparatus of claim 1, wherein said rotary holder is situated within said vacuum chamber such that an angle formed between two imaginary lines, one extending from a center of an evaporation surface of said ceramic material within said primary crucible and one extending from a center of an evaporation surface of said secondary ceramic or metallic material with said secondary crucible, that intersect at a rotation axis of said rotary holder may be 20 xdegrees or greater wherein the rotary holder's axis of rotation is an axis perpendicular to the plane including the two imaginary lines.

15. An apparatus for coating an article comprising:
a vacuum chamber;
a plurality of electron beam guns disposed at least partially within the vacuum chamber and configured to emit electron beams;
a primary crucible containing primary ceramic materials and positioned internally within said vacuum chamber to produce a first vapor cloud of the primary ceramic materials when impacted by the electron beams;
a secondary crucible containing a secondary ceramic or metallic material and disposed internally within said vacuum chamber and spatially separated from said primary crucible to produce a second vapor cloud of the secondary ceramic or metallic material when impacted by the electron beams, said second vapor cloud creating a mixing zone of said first vapor cloud and said second vapor cloud;
a holder mounted within said vacuum chamber and configured and positioned relative to said primary crucible and said secondary crucible to hold and move the article within said first vapor cloud and said mixing zone of the first vapor cloud and the second vapor cloud so that an alternating sequence of only two non-homogeneous, nanometer-to-micron thickness layers are deposited on the article, the first and second vapor clouds coexisting within the vacuum chamber while the article is moved on said holder; and
a plurality of tubes protruding into said vacuum chamber for supplying oxygen gas to the article, said plurality of tubes directing said oxygen gas toward said holder;
wherein upon actuation of said plurality of electron beam guns and release of said oxygen gas into said vacuum chamber toward said article, the first vapor cloud and the second vapor cloud are produced from said primary and secondary crucibles, respectively, said spatial separation between said primary crucible and said secondary crucible enabling the first vapor cloud to evaporate from said primary crucible towards a location of said holder, and the second vapor cloud to evaporate from said secondary crucible, wherein the first and second vapor clouds thus coat the article with a multilayer thermal barrier coating composed of said alternating sequence of said only two non-homogeneous, nanometer to micron thickness layers of ceramic material and wherein said layers include:
a layer of said primary ceramic material with dispersed oxide particles of said secondary ceramic or oxidized metallic material; and
a multiphase interfacial layer separating layers of said primary ceramic material, said multiphase interfacial layer comprising finely dispersed nanometer-sized particles of secondary ceramic or oxidized metallic material, said primary ceramic material, and nanometer-sized porosity.

16. The apparatus of claim 15, wherein said plurality of electron beam guns are configured such that power from said electron beams is apportioned to said primary and secondary crucibles such that a majority of said first and second vapor clouds that deposits onto the article will be derived from said primary crucible and the balance of said first and second vapor clouds that deposits onto the article will be derived from said secondary crucible.

17. The apparatus of claim 15, wherein said plurality of electron beam guns are configured such that power from one of said plurality of electron beam guns directed at said secondary crucible is periodically pulsed to change an evaporation rate of said secondary ceramic or metallic material to a fraction of a rate of evaporation of said primary ceramic material from said primary crucible, and to enable deposition of said multilayer thermal barrier coating composed of said alternating sequence of said only two non-homogeneous layers.

18. The apparatus of claim 15, wherein said plurality of electron beam guns are configured such that rates of coating deposition and article rotation are controlled such that a multilayer zone within the thermal barrier coating may have a minimum of one interfacial layer per micron of coating thickness.

19. The apparatus of claim 15, wherein at least one of said plurality of electron beam guns is configured such that evaporation from said secondary crucible is pulsed.

20. The apparatus of claim 15, wherein one of said plurality of electron beam guns protrudes into said vacuum chamber, and said one of said plurality of electron beam guns is configured such that an electron beam emitted from said one of said plurality of electron beam guns jumps between said primary and secondary crucibles to achieve continuous rates of evaporation.

21. The apparatus of claim 15, further comprising a gas source coupled to supply an inert gas and oxygen gas traversing through said tubes.

22. The apparatus of claim 15, further comprising RF ion generators for ionizing RF electrical fields to ionize said first and second vapor clouds.

23. The apparatus of claim 15, wherein said first vapor cloud is a stabilized zirconia vapor cloud, and said second vapor cloud comprises alumina or tantalum oxide vapor.

24. A coating deposition apparatus for coating an article, the apparatus comprising:
a vacuum chamber;
one or more electron beam guns disposed at least partially within said vacuum chamber and configured to emit electron beams;
a primary crucible containing a primary ceramic material and positioned internally within said vacuum chamber to produce a first vapor cloud of the primary ceramic material when impacted by the electron beams;
a secondary crucible containing a secondary ceramic or metallic material and positioned internally within said vacuum chamber, spatially separated from said primary crucible to produce a second vapor cloud of the secondary ceramic or metallic material when impacted by the electron beams and to produce a mixing zone of said first vapor cloud and said second vapor cloud;
a holder rotationally mounted within said vacuum chamber and adapted and positioned relative to said primary crucible and said secondary crucible to rotate the article within said first vapor cloud and said mixing zone of the first vapor cloud and the second vapor cloud so that only two alternating non-homogeneous layers are deposited on the article, a first of said two alternating non-homogeneous layers comprising said primary ceramic material and a second of said two alternating non-homogeneous layers comprising said primary ceramic material and said secondary ceramic or metallic material, wherein the first and second vapor clouds coexist within the vacuum chamber while the article is rotated on the rotary holder, and a separation distance between the holder and said primary crucible and said secondary crucible is sufficiently great to limit radiant heating of a surface of the article to a maximum of 1150° C.;
at least one heat source that maintains the article to be coated within a temperature range during deposition of the coating;
one or more gas bleed supply tubes protruding into said vacuum chamber, each tube having an opening within the vacuum chamber for aiming a gas toward the holder; and
a gas source, coupled to supply a gas through said one or more gas bleed supply tubes.

25. A thermal barrier coating deposition apparatus for coating an article, the apparatus comprising:
a vacuum chamber;
at least one electron beam gun disposed at least partially within said vacuum chamber and configured to emit at least one electron beam;
a primary crucible configured to contain a primary ceramic material and positioned within said vacuum chamber to produce a first vapor cloud of said primary ceramic material when impacted by said at least one electron beam;
a secondary crucible configured to contain a secondary ceramic or metallic material and positioned within said vacuum chamber to produce a second vapor cloud of said secondary ceramic or metallic material when impacted by said at least one electron beam and to produce a mixing zone of said first vapor cloud and said second vapor cloud; and
a rotary holder rotationally mounted within said vacuum chamber, wherein said rotary holder is situated within said vacuum chamber such that an angle of 20 degrees or greater is formed between two imaginary lines, one imaginary line extending from a rotation axis of said rotary holder to a center of an evaporation surface of said primary ceramic material within said primary crucible and the other imaginary line extending from the rotation axis of said rotary holder to a center of an evaporation surface of said secondary ceramic or metallic material with said secondary crucible
wherein the rotary holder's axis of rotation is an axis perpendicular to the plane including the two imaginary lines.

* * * * *

UNITED STATES PATENT AND TRADEMARK OFFICE
CERTIFICATE OF CORRECTION

| | |
|---|---|
| PATENT NO. | : 7,556,695 B2 |
| APPLICATION NO. | : 10/140343 |
| DATED | : July 7, 2009 |
| INVENTOR(S) | : Strangman et al. |

Page 1 of 1

It is certified that error appears in the above-identified patent and that said Letters Patent is hereby corrected as shown below:

Column 9, line 61, "xdegrees" should be changed to --degrees--.

Signed and Sealed this

Twentieth Day of October, 2009

David J. Kappos
*Director of the United States Patent and Trademark Office*